United States Patent [19]
Ko

[11] Patent Number: 5,552,738
[45] Date of Patent: Sep. 3, 1996

[54] HIGH PERFORMANCE ENERGY EFFICIENT PUSH PULL D FLIP FLOP CIRCUITS

[75] Inventor: Uming Ko, Plano, Tex.

[73] Assignee: Texas Instruments Incorporated, Dallas, Tex.

[21] Appl. No.: 426,299

[22] Filed: Apr. 21, 1995

[51] Int. Cl.$^6$ ................................................ H03K 3/356
[52] U.S. Cl. ......................... 327/203; 327/208; 327/218
[58] Field of Search ...................................... 327/199, 200, 327/201, 202, 203, 208, 210, 211, 212, 214, 218, 219

[56] References Cited

U.S. PATENT DOCUMENTS

| 5,227,674 | 7/1993 | Takahashi et al. | 327/202 |
| 5,321,399 | 6/1994 | Notani et al. | 327/203 |

FOREIGN PATENT DOCUMENTS

| 4243313 | 8/1992 | Japan | 327/203 |
| 5259834 | 10/1993 | Japan | 327/208 |
| 3443788 | 6/1986 | Netherlands | 327/203 |

*Primary Examiner*—Timothy P. Callahan
*Assistant Examiner*—Eunja Shin
*Attorney, Agent, or Firm*—Robert D. Marshall, Jr.; James C. Kesterson; Richard L. Donaldson

[57] ABSTRACT

An energy efficient D flip-flop circuit has a master latch, a slave latch and a push-pull circuit. This push-pull circuit includes an inverter having an input connected to the output of the master latch and a transmission gate clocked in a second phase having an input connected to the output of the inverter and an output connected to the output of the slave latch. This push-pull circuit speeds the C-to-Q delay time of the circuit because there is only one gate delay to output using this circuit. The master and slave latches may employ P-type MOSFETs in the feedback path. The master latch may employ a double pass transistor logic input. The push-pull circuit may employ a tri-state invertor in place of the inverter and transmission gate.

16 Claims, 2 Drawing Sheets 5,552,738

HIGH PERFORMANCE ENERGY EFFICIENT PUSH PULL D FLIP FLOP CIRCUITS

TECHNICAL FIELD OF THE INVENTION

The technical field of this invention is energy efficient electronic circuits and particularly energy efficient D flip-flop circuits used in control logic in microprocessors.

BACKGROUND OF THE INVENTION

D flip-flops are one of major functions in finite state machines, which in turn is the critical part of control logic. It is known that the control logic of a microprocessor can occupy 20% of the processor's power. As more advanced architecture concepts, such as register renaming and out-of-order execution in a superscalar microprocessor, are used, the control logic Will likely be more complicated and its power dissipation will likely grow beyond this current level. In addition, to boost processor clock frequency, modern processors typically adopt superpipelined execution which uses D flip-flops. Enhancing the speed of D flip-flops can either enable a higher clock rate or allow more logic depths between two pipeline registers. These two objectives of low power and high speed provide a need in the art for circuits, such as D flip-flop circuits, which are energy efficient.

SUMMARY OF THE INVENTION

This invention is an energy efficient D flip-flop circuit. This circuit has a master latch and a slave latch. The master latch has an input serving as the circuit input that is clocked in a first phase. The slave latch has an input connected to the output of the master latch clocked in a second phase opposite to the first phase. The output of the slave latch is the output of the circuit. This circuit also has a push-pull circuit including an inverter having an input connected to the output of the master latch and a transmission gate clocked in the second phase having an input connected to the output of the inverter and an output connected to the output of the slave latch. This push-pull circuit speeds the C-to-Q delay time of the circuit because there is only one gate delay to output using this circuit.

The master and slave latches employ cross-coupled inverters. These may either be connected directly or the feedback path may be via a P-type MOSFET. The feedback MOSFET of the master latch is clocked in the first phase and the feedback MOSFET of the slave latch is clocked in the second phase.

The master latch may employ a double pass transistor logic input. This doublepasstransistor logic input includes an N-type MOSFET having a source-drain path connected between the input of the D flip-flop circuit and a common terminal. Its base receives the clock signal in the first phase and a P-type MOSFET having a source-drain path connected between the clock signal in the first phase and the common terminal. Its base receives an inverse of the input signal.

The slave latch may employ a tri-state invertor in the push-pull circuit in place of the inverter and transmission gate.

BRIEF DESCRIPTION OF THE DRAWINGS

These and other aspects of this invention are illustrated in the drawings,in which.

DETAILED DESCRIPTION OF PREFERRED EMBODIMENTS

Microprocessor integrate circuit design is a compromise among a number of factors. Ideally such circuits should be high performance, use little power and require few transistors. Naturally these goals are contradictory. In the current art circuits are constructed with gates of less than one micron. In this environment the area employed by the transistors is less of a difficulty because the circuit densities are very high. However, the goals of high performance and hence high speed of operation is generally inversely related to low power of operation. A rough measure of the compromise between these conflicting goals is energy efficiency. One measure of energy efficiency for microprocessor integrated circuits is:

$$E_{IC} = \frac{F}{P}$$

where:

$E_{IC}$ is the integrated circuit power efficiency measure; F is the frequency of operation in MHz; and P is the electric power consumed in watts. This measure provides a satisfactory rating for entire integrated circuits, however, it is not well suited for rating individual circuits. One measure of energy efficiency for individual circuits is:

$$E_{circuit} = \frac{1}{D \times P}$$

where:

$E_{circuit}$ is the circuit power efficiency measure; D is the circuit delay time in picoseconds; and P is the electric energy consumed in femtojoules. This rating provides a manner for ranking candidate designs when selecting circuit designs for microprocessor integrated circuits.

Figure 1:
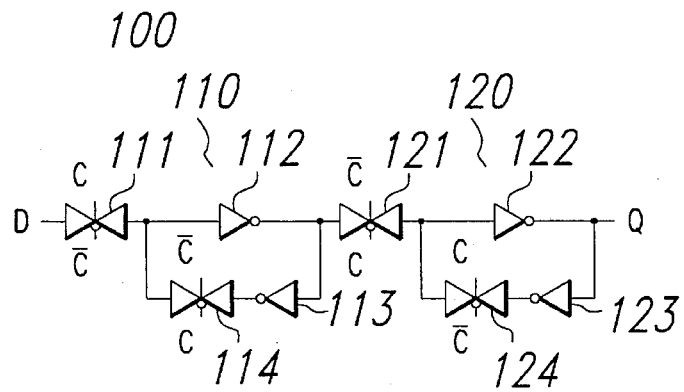
FIG. 1 illustrates in schematic diagram form a common D flip flop circuit of the prior art.

FIG. 1 illustrates a negative edge-triggered D flip-flop 100 of the prior art. This circuit 100 consists of a master latch 110 and a slave latch 120. Master latch 110 includes an input transmission gate 111, a first inverter 112, a second inverter 113 and a feedback transmission gate 114. The input signal D is supplied to input transmission gate 111 of master latch 110. The output of the master latch supplies the input of the slave latch. The slave latch likewise includes an input transmission gate 121, a first inverter 122, a second inverter 123 and a feedback transmission gate 124. Note that the input transmission gate 111 of master latch 110 is clocked in the opposite phase than the input transmission gate 121 of slave latch 120. Thus these transmission gates conduct on opposite phase of the clock signal C. Inverter 122 of slave latch 120 generates the circuit output signal Q. This circuit illustrated in FIG. 1 can be constructed with 16 MOSFETs. The speed of this regular D flip-flop is limited by a two-gate delay after the clock signal C transitions from logic 1 to 0. The advantage of this D flip-flop design is that it involves minimum design risk.

Figure 2:
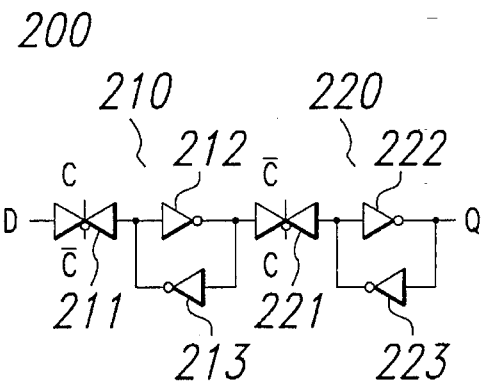
FIG. 2 illustrates in schematic diagram form a common low area D flip flop circuit of the prior art.

A common approach in the prior art to reduce area of the regular D flip-flop 100 is to remove the two feedback transmission gates 114 and 124. FIG. 2 illustrates this low-area D flip-flop circuit 200. Low-area D flip-flop circuit 200 can be constructed using 12 MOSFETS, 25% fewer transistors than the D flip-flop circuit 100. This reduces the integrated circuit area needed to construct the D flip-flop. The low-area D flip-flop circuit 200 has the disadvantage of consuming more power. The strength of feedback inverters 213 and 223 can be weakened to minimize the short-circuit power dissipation due to voltage contention. Design simulations indicate that the low-area D flip-flop circuit 200 consumes 18% more total power and is 42% slower than that of the regular D flip-flop circuit 100.

Figures 3, 4:
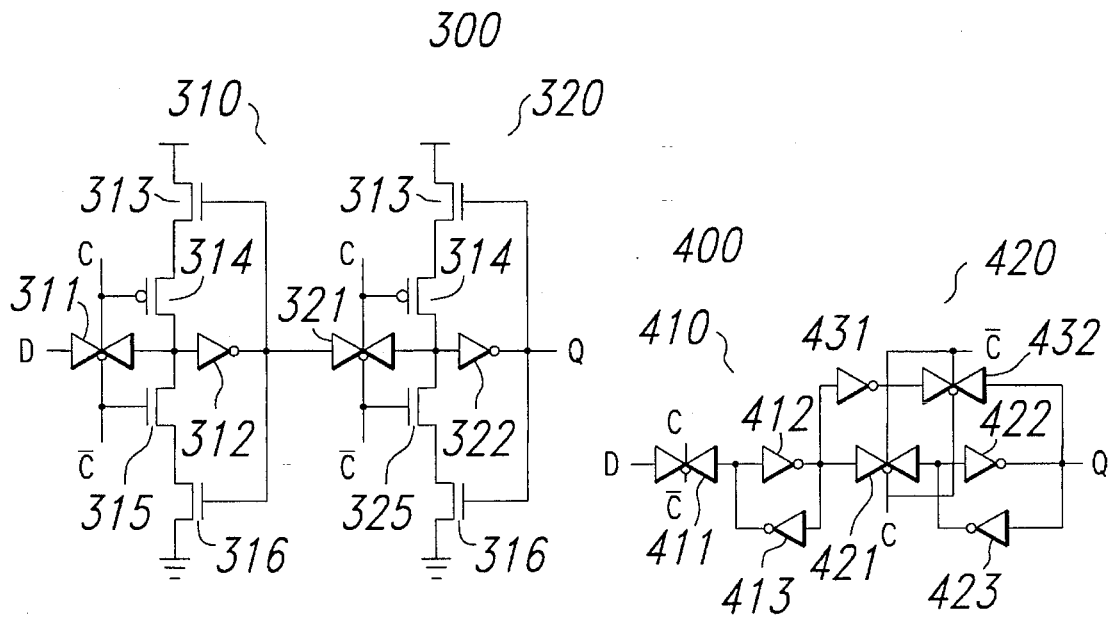
FIG. 3 illustrates in schematic diagram form a common low power D flip flop circuit of the prior art.
FIG. 4 illustrates in schematic diagram form a push pull D flip flop circuit in accordance with this invention.

One approach in the prior art to optimize the D flip-flop for power dissipation is to replace the inverter 113 and transmission gate 114 in the feedback path of the master latch 110 with a tri-state inverter. Another tri-state invertor replaces the inverter 123 and the transmission gate 124 in the feedback path of the slave latch. FIG. 3 illustrates this low-power D flip-flop circuit 300. The tri-state inverter in the master latch 310 includes P-type MOSFETs 313 and 314, and N-type MOSFETs 315 and 316. The tri-state inverter in the slave latch 320 includes P-type MOSFETs 323 and 324, and N-type MOSFETs 325 and 326. Low-power D flip-flop circuit 300 can be constructed with 16 MOSFETs, the same number as the regular D flip-flop circuit 100. Only one of MOSFETs 314 or 315 is conductive at one time depending upon the polarity of the clock signal C. Similarly, only one of MOSFETs 324 or 325 is conductive at one time. This avoids short-circuit power dissipation in the feedback path. Design simulations indicate that this yields only 1% reduction in total power and 3% slower speed when compared to the regular D flip-flop circuit 100. Circuit simulations indicate that low-power D flip-flop circuit 300 is comparable to the regular D flip-flop circuit 100 in area and energy efficiency.

FIG. 4 illustrates a circuit according to a first embodiment of the invention. To optimize for speed, an inverter 431 and a transmission gate 432 are added between outputs of master latch 410 and slave latch 420. This accomplishes a push-pull effect at slave latch 420. This adds four MOSFETs, but reduces the clock-to-output (C-to-Q) delay from two gates in the regular D flip-flop circuit 100 to one gate. To offset the four added MOSFETs in the push-pull circuit, the two transmission gates 114 and 124 in feedback paths of the regular D flip-flop circuit 100 are eliminated in a manner similar to the low-area D flip-flop circuit 200. This yields a circuit employing 16 MOSFETs, the same as the regular D flip-flop circuit 100. Compared to the regular D flip-flop circuit 100, circuit simulations indicate that this push-pull D flip-flop circuit 400 is 31% faster but employs 22% more power. This increase in speed more than offsets the increase in power, yielding a circuit having a higher energy efficiency than the regular D flip-flop circuit 100.

Figure 5:
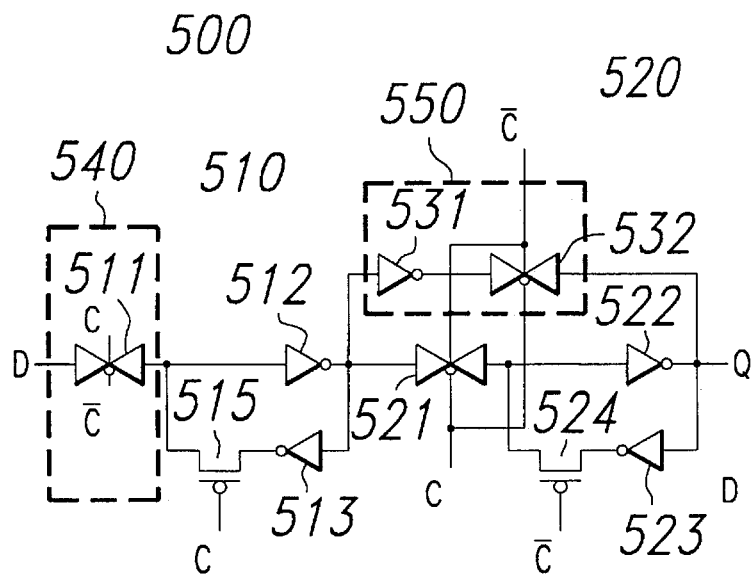
FIG. 5 illustrates schematic diagram form a push pull isolation D flip flop circuit in accordance with this invention.

FIG. 5 illustrates an alternative and preferred embodiment of this invention which uses less power. To optimize for energy usage in the push-pull D flip-flop, two P-type MOSFETs 515 and 525 are added to isolate the feedback path. The source-drain path of MOSFET 515 connects the output of inverter 513 to the input of inverter 512. The base of MOSFET 515 receives the clock signal. The source-drain path of MOSFET 525 connects the output of inverter 523 to the input of inverter 522. The base of MOSFET 525 receives the inverse of the clock signal. This push-pull isolation D flip-flop circuit 500 has an increased transistor count of 18, but circuit simulations indicate that it achieves a 16% reduction in total power and an increase in speed of 25% relative to the push-pull D flip-flop circuit 400. Compared to the regular D flip-flop circuit 100, the push-pull isolation D flip-flop circuit 500 is 56% faster at an expense of 6% more power consumption. Due to the greater increase in speed than increase in power, push-pull isolation D flip-flop 500 has a higher energy efficiency than regular D flip-flop circuit 100.

Figure 6:
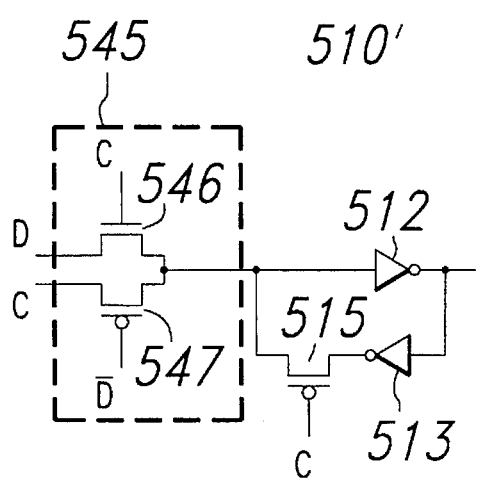
FIG. 6 illustrates an alternative circuit for the master latch of the D flip fop of FIGS. 4 or 5.

FIG. 6 illustrates a variation of the circuits of FIGS. 4 and 5. A technique known in the art as double pass transistor logic is used at the input to the D flip-flop circuit. This technique is generally believed in he art to result in faster circuit operation. The input section 540 illustrated in FIG. 5, consisting of a transmission gate, is replaced by input section 545, consisting of N-type MOSFET 546 and P-type MOSFET 547. N-type MOSFET 546 has its source-drain path connected between the input signal D and the input to inverter 512. Its base receives the clock signal. P-type MOSFET has its source-drain path connected between the clock signal and the input to inverter 512. Its base receives the inverse of the input signal $\overline{D}$. Note FIG. 6 illustrates only master latch 510', the slave latch of this D flip-flop could be as illustrated at 420 in FIG. 4 or 520 in FIG. 5. A push-pull isolation double pass transistor logic input D flip-flop has a 20% reduction in the setup time as compared to push-pull isolation D flip-flop 500. However, when D is logic 1 and C switches from logic 1 to 0, a DC-path exists from invertor 513, P-type isolation MOSFET 515, P-type input MOSFET 547 and the clock input. This causes a circuit employing this double pass transistor logic input 545 to consume 60% more power relative to the push-pull isolation D flip-flop circuit 500. Since this additional power consumption is greater than the addition speed, this results in a lower power efficiency.

Figure 7:
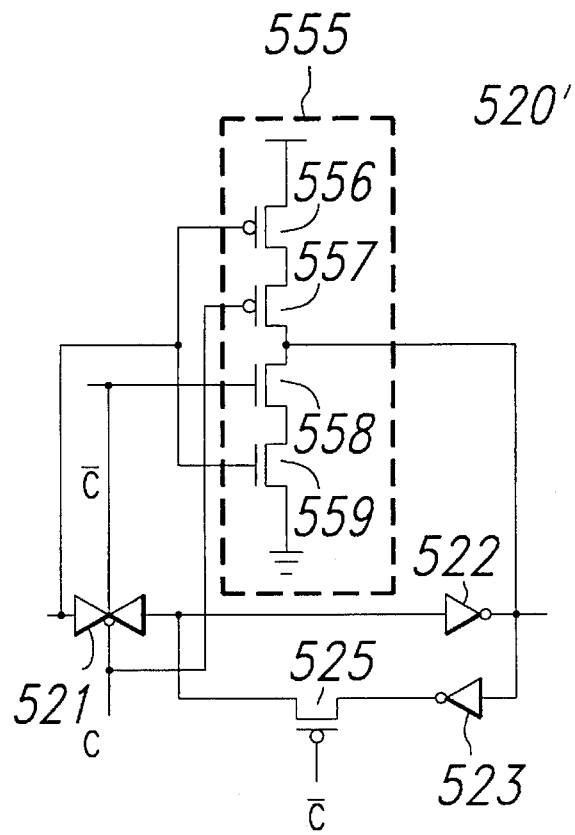
FIG. 7 illustrates an alternative circuit for the slave latch of the D flip flop of FIGS. 4 or 5.

FIG. 7 illustrates another variation of the circuits of FIGS. 4 and 5. The push-pull section 550 of push-pull isolation D flip-flop circuit 500, consisting of inverter 531 and transmission gate 532, is replaced by a tri-state inverter. Note FIG. 6 illustrates only slave latch 520', the master latch of this D flip-flop could be as illustrated at 410 in FIG. 4 or 120 in FIG. 5. The tri-state inverter includes P-type MOSFETs 551 and 552, and N-type MOSFETs 315 and 316. Though this variation reduces the short-circuit power consumption of the push-pull driver, circuit simulations indicate that it weakens the drive strength due to stacked MOSFETs. This circuit is thus 10% less efficient in energy compared to the push-pull isolation D flip-flop circuit 500.

Table 1 lists the essential parameters of D flip-flop circuits shown in FIGS. 1 to 5. The regular column refers to circuit 100 illustrated in FIG. 1, the low-area column refers to circuit 200 illustrated in FIG. 2, the low-power column refers to circuit 300 illustrated in FIG. 3, the push-pull column refers to circuit 400 illustrated in FIG. 4 and the push-pull isolation column refers to circuit 500 illustrated in FIG. 5 Table 1 does not cover the variations illustrated in FIGS. 6 and 7. Note that the percentage figures for average power, delay time and energy are relative to push-pull isolation D flip-flop circuit 500 as 100%.

TABLE 1

| Parameters 3.3V, 100 MHz | Regular | Low-area | Low-power | Push-pull | Push-pull isolation | unit |
|---|---|---|---|---|---|---|
| number of transistors | 16 | 12 | 16 | 16 | 18 | transistors |
| Power average | 122.9 | 146.9 | 121.7 | 152.6 | 131.4 | μW |
| percentage | 94 | 112 | 93 | 116 | 100 | % |
| Delay, C-to-Q | 245.0 | 311.5 | 250.0 | 195.5 | 157.0 | ps |
| percentage | 156 | 198 | 159 | 125 | 100 | % |
| Energy | 30.11 | 45.75 | 30.41 | 29.83 | 20.63 | fJ |
| percentage | 146 | 222 | 147 | 145 | 100 | % |

In summary, Table 1 shows the low-area D flip-flop circuit 200, which uses fewer transistors, internal consumes more energy than the rest of D flip-flops circuits. Compared to a regular D flip-flop circuit 100, a low-power D flip-flop circuit 200 decreases power dissipation by 1% and a push-pull D flip-flop circuit 300 reduces delay by 31%. These two circuits end up with a comparable energy efficiency. The proposed push-pull isolation D flip-flop circuit 500 improves speed by 56% at the expense Of only 6% of more power, when compared to regular D flip-flop 100. The energy efficiency of this push pull isolation D flip-flop circuit 500 is 45 to 122% higher than that of the other D flip-flops circuits.

What is claimed is:

1. A D flip-flop circuit having and input and an output comprising:
   a master latch having an input serving as input of said D flip-flop circuit clocked in a first phase and an output;
   a slave latch having an input connected to said output of said master latch clocked in a second phase opposite to said first phase and a non-clocked static output serving as output of said D flip-flop circuit; and
   a push-pull circuit including
      an inverter having an input connected to said output of said master latch and an output, and
      a transmission gate clocked in said second phase having an input connected to said output of said inverter and an output connected to said output of said slave latch.

2. The D flip-flop circuit of claim 1, wherein:
   said master latch includes
      a transmission gate clocked in said first phase having an input serving as input to said master latch and an output,
      a first master latch inverter having an input connected to said output of said transmission gate and an output serving as output of said master latch, and
      a second master latch inverter having an input connected to said output of said first master latch inverter and an output connected to said input of said first master latch inverter.

3. The D flip-flop circuit of claim 1, wherein:
   said master latch includes
      a transmission gate clocked in said first phase having an input serving as input to said master latch and an output,
      a first master latch inverter having an input connected to said output of said transmission gate and an output serving as output of said master latch,
      a second master latch inverter having an input connected to said output of said first master latch inverter and an output, and
      a P-type MOSFET having a source-drain path connected between said output of said second master latch inverter and said input of said first master latch inverter and a base receiving a clock signal in said first phase.

4. The D flip-flop circuit of claim 1, wherein:
   said slave latch includes
      a transmission gate clocked in said second phase having an input serving as input to said slave latch and an output,
      a first slave latch inverter having an input connected to said output of said transmission gate and an output serving as output of said slave latch, and
      a second slave latch inverter having an input connected to said output of said first slave latch inverter and an output connected to said input of said first slave latch inverter.

5. The D flip-flop circuit of claim 1, wherein:
   said slave latch includes
      a transmission gate clocked in said second phase having an input serving as input to said slave latch and an output,
      a first slave latch inverter having an input connected to said output of said transmission gate and an output serving as output of said slave latch,
      a second slave latch inverter having an input connected to said output of said first slave latch inverter and an output, and
      a P-type MOSFET having a source-drain path connected between said output of said second slave latch inverter and said input of said first slave latch inverter and a base receiving a clock signal in said second phase.

6. A D flip-flop circuit having and input and an output comprising:
   a master latch having a double pass transistor logic input serving as input of said D flip-flop circuit clocked in a first phase and an output, said double pass transistor logic input including
      an N-type MOSFET having a source-drain path connected between said input of said D flip-flop circuit and a common terminal and a base receiving a clock signal in a first phase, and
      a P-type MOSFET having a source-drain path connected between said clock signal in said first phase and said common terminal and a base receiving an inverse of said signal at said input of said D flip-flop circuit;
   a slave latch having an input connected to said output of said master latch clocked in a second phase opposite to said first phase and a non-clocked static output serving as output of said D flip-flop circuit; and a push-pull circuit including
   an inverter having an input connected to said output of said master latch and an output, and
   a transmission gate clocked in said second phase having an input connected to said output of said inverter and an output connected to said output of said slave latch.

7. The D flip-flop circuit of claim 6, wherein:
said master latch further includes
   a first master latch inverter having an input connected to said common terminal of said double pass transistor logic input and an output serving as output of said master latch, and
   a second master latch inverter having an input connected to said output of said first master latch inverter and an output connected to said input of said first master latch inverter.

8. The D flip-flop circuit of claim 6, wherein:
said master latch further includes
   a first master latch inverter having an input connected to said common terminal of said double mass transistor logic input and an output serving as output of said master latch,
   a second master latch inverter having an input connected to said output of said first master latch inverter and an output, and
   a P-type MOSFET having a source-drain path connected between said output of said second master latch inverter and said input of said first master latch inverter and a base receiving a clock signal in said first phase.

9. The D flip-flop circuit of claim 6, wherein:
said slave latch includes
   a transmission gate clocked in said second phase having an input serving as input to said slave latch and an output,
   a first slave latch inverter having an input connected to said output of said transmission gate and an output serving as output of said slave latch, and
   a second slave latch inverter having an input connected to said output of said first slave latch inverter and an output connected to said input of said first slave latch inverter.

10. The D flip-flop circuit of claim 6, wherein:
said slave latch includes
   a transmission gate clocked in said second phase having an input serving as input to said slave latch and an output,
   a first slave latch inverter having an input connected to said output of said transmission gate and an output serving as output of said slave latch,
   a second slave latch inverter having an input connected to said output of said first slave latch inverter and an output, and
   a P-type MOSFET having a source-drain path connected between said output of said second slave latch inverter and said input of said first slave latch inverter and a base receiving a clock signal in said second phase.

11. A D flip-flop circuit having and input and an output comprising:
   a master latch having an input serving as input of said D flip-flop circuit clocked in a first phase and an output;
   a slave latch having an input connected to said output of said master latch clocked in a second phase Opposite to said first phase and a non-clocked static output Serving as output of said D flip-flop circuit; and
   a tri-state inverter clocked in said second phase having an input connected said output of said master latch and an output connected to said output of said slave latch.

12. The D flip-flop circuit of claim 11, wherein:
said tri-state inverter includes
   a first P-type MOSFET having a source-drain path connected between a supply voltage and a first common terminal and a base connected to said output of said master latch,
   a second P-type MOSFET having a source-drain path connected between said first common terminal and said output of said slave latch and a base receiving a clock signal in said first phase,
   a first N-type MOSFET having a source-drain path connected between said output of said slave latch and a second common terminal and a base receiving said clock signal in said second phase inverse to said first phase, and
   a second N-type MOSFET having a source-drain path connected between said second common terminal and ground and a base connected to said output of said master latch.

13. The D flip-flop circuit of claim 11, wherein:
said master latch includes
   a transmission gate clocked in said first phase having an input serving as input to said master latch and an output,
   a first master latch inverter having an input connected to said output of said transmission gate and an output serving as output of said master latch, and
   a second master latch inverter having an input connected to said output of said first master latch inverter and an output connected to said input of said first master latch inverter.

14. The D flip-flop circuit of claim 11, wherein:
said master latch includes
   a transmission gate clocked in said first phase having an input serving as input to said master latch and an output,
   a first master latch inverter having an input connected to said output of said transmission gate and an output serving as output of said master latch,
   a second master latch inverter having an input connected to said output of said first master latch inverter and an output, and
   a P-type MOSFET having a source-drain path connected between said output of said second master latch inverter and said input of said first master latch inverter and a base receiving a clock signal in said first phase.

15. The D flip-flop circuit of claim 11, wherein:
said slave latch includes
   a transmission gate clocked in said second phase having an input serving as input to said slave latch and an output,
   a first slave latch inverter having an input connected to said output of said transmission gate and an output serving as output of said slave latch, and
   a second slave latch inverter having an input connected to said output of said first slave latch inverter and an output connected to said input of said first slave latch inverter.

16. The D flip-flop circuit of claim 11, wherein:
said slave latch includes
   a transmission gate clocked in said second phase having an input serving as input to said slave latch and an output, a first slave latch inverter having an input connected to said output of said transmission gate and an output serving as output of said slave latch,
a second slave latch inverter having an input connected to said output of said first slave latch inverter and an output, and
a P-type MOSFET having a source-drain path connected between said output of said second slave latch inverter and said input of said first slave latch inverter and a base receiving a clock signal in said second phase.

\* \* \* \* \*